(12) United States Patent
Lo et al.

(10) Patent No.: US 7,030,656 B2
(45) Date of Patent: Apr. 18, 2006

(54) LOW VOLTAGE DIFFERENTIAL SIGNALING DEVICE WITH FEEDBACK COMPENSATION

(75) Inventors: Hua-Jan Lo, Hsinchu (TW); Simon Lin, Hsinchu (TW); June Chen, Hsinchu (TW); Wei-Shang Chu, Hsinchu (TW)

(73) Assignee: Via Technologies, Inc., Shindian (TW)

( * ) Notice: Subject to any disclaimer, the term of this patent is extended or adjusted under 35 U.S.C. 154(b) by 52 days.

(21) Appl. No.: 10/736,238

(22) Filed: Dec. 12, 2003

(65) Prior Publication Data
US 2004/0150634 A1 Aug. 5, 2004

(30) Foreign Application Priority Data
Dec. 12, 2002 (TW) ................ 91135916 A

(51) Int. Cl.
H03K 19/094 (2006.01)
(52) U.S. Cl. ............... 326/86; 326/26; 326/82; 326/90
(58) Field of Classification Search ............ 326/26–27, 326/82–83, 86, 90
See application file for complete search history.

(56) References Cited

U.S. PATENT DOCUMENTS

| 6,025,792 | A | 2/2000 | Smith | |
|---|---|---|---|---|
| 6,356,141 | B1 * | 3/2002 | Yamauchi | 327/543 |
| 6,639,434 | B1 * | 10/2003 | Rahman | 327/108 |
| 6,744,280 | B1 * | 6/2004 | Morgan et al. | 326/86 |

OTHER PUBLICATIONS

Liu, Xiang-yuan, et al., "The Study and Design of High-Speed LVDS I/O Interface Cells," Computer Engineering & Science, vol. 23, No. 4, 2001. p. 52-57.

* cited by examiner

Primary Examiner—Anh Q. Tran
(74) Attorney, Agent, or Firm—Madson & Austin

(57) ABSTRACT

A low voltage different signaling (LVDS) includes an LVDS transmitter and an LVDS receiver. The LVDS transmitter includes a feedback compensation circuit, which adjusts and stabilizes the analog image signal to be transmitted to the LVDS receiver according to the voltage difference of the analog image signal and a base signal. The feedback compensation circuit includes a voltage-to-current converting circuit and a pair of current mirror circuits.

15 Claims, 5 Drawing Sheets

LOW VOLTAGE DIFFERENTIAL SIGNALING DEVICE WITH FEEDBACK COMPENSATION

FIELD OF THE INVENTION

The present invention relates to a low voltage differential signaling device, and more particularly to a low voltage differential signaling device with feedback compensation.

BACKGROUND OF THE INVENTION

With the highly development of the internet, various kinds of data transmission on the internet are required. Therefore, a diversity of communication and transmission means are developed and used to facilitate the work on the internet. Particularly for the means requiring large bandwidth for supporting serial data flow, e.g. digital display, high resolution frame or color graphics, the transmission of the large amount of data relies much on the analog technique to design circuit system and support data transmission. Low voltage differential signaling (LVDS) is one of the analog techniques for transmission. This technique can be utilized to design hybrid signaling systems. The LVDS technique is a high-speed analog circuiting technique, which supports data transmission on copper wires in a multi-gigabit order.

Since LVDS transmission technique is a universal interface standard for high-speed, low-power and low noise data transmission, it can be well applied to the system structure requiring modulating digital image signals into analog image signals and transmitting the analog image signals to a digital display at a high rate.

Please refer to FIG. 1, which is a functional block diagram schematically showing a digital display system using LVDS transmission technique. The system comprises a computer host 10 and a display host 20 such as a liquid crystal display (LCD). An image control chip 101 inside the computer host 10 outputs a digital image signal S1 to an LVDS transmitter 102 to be modulated into an analog image signal S10 having a swing as low as 300 mV~350 mV. Then, via an LVDS driving circuit 1021, the analog image signal S10 is outputted to an LVDS receiver 201.

In order to modulate and recover the analog image signal S10 into the digital image signal S1 capable of being processed by the downstream devices such as a timing control device 202 and a display driving device 203, at least two resistors (FIG. 2, R1 and R2) are arranged at the input of the LVDS receiver 201.

The circuit of a conventional LVDS driving circuit 1021 is shown in FIG. 2. The skeleton of the circuit is a differential amplifier comprising of four transistors Q1~Q4, from which the analog image signal S10 is generated and outputted to the resistors R1 and R2 of the LVDS receiver 201. On the other hand, the transistor Q5 and the parallelly interconnected transistors Q6 and Q7 constitute a first and a second current sources, respectively, wherein the first current source is electrically connected to a power source +Vcc and the differential amplifier, and the second current source is electrically connected to the differential amplifier and ground. By way of the first and the second current sources, a constant source current Io is provided for the differential amplifier. The voltage state of the constant current source can be stabilized with the presence of the transistor Q8.

As is understood by those skilled in the art, the properties of the transistors Q5, Q6 and Q7, which serve as the first and the second current sources, likely vary with some certain or uncertain factors during the manufacturing process. Once this happens, the constant source current Io provided for the differential amplifier comprising of the transistors Q1~Q4 will deviate from the originally designed specification so as to make the voltage swing Va of the analog image signal S10 outputted by the differential amplifier beyond the predetermined range. Then, the erroneous operation of the downstream LVDS receiver 201 may be rendered. Unfortunately, the signal drift problem resulting from the manufacturing factors of the above-mentioned LVDS driving circuit 1021 cannot be solved in the conventional LVDS transmitter 102.

SUMMARY OF THE INVENTION

Therefore, it is an object of the present invention to provide a low voltage differential signaling device, the output signal of which is capable of exempting from the effect of manufacturing factors.

A first aspect of the present invention relates to a low voltage differential signaling (LVDS) transmitting device, which comprises a signal driving circuit for generating and outputting an analog image signal to an LVDS receiving device; and a signal compensation circuit in communication with the signal driving circuit, generating a compensation signal in response to the analog image signal and a base signal, and feeding the compensation signal back to the signal driving circuit to adjust the analog image signal.

In an embodiment, the signal compensation circuit comprises a voltage-to-current converting circuit for outputting the compensation signal as a current type in response to the analog image signal and the base signal; and a first and a second current mirror circuits for feeding the compensation signal back to the signal driving circuit, wherein the first current mirror circuit is coupled to the voltage-to-current converting circuit and ground, and the second current mirror circuit is coupled to the first current mirror circuit, a power source and a differential signaling circuit of the signal driving circuit.

Preferably, the voltage-to-current converting circuit outputs the compensation signal according to a voltage difference between the analog image signal and base signal.

Preferably, the signal driving circuit comprises a first and a second current sources and a differential signaling circuit, wherein the first current source comprises a transistor coupled between a power source and the differential signaling device, the second current source comprises at least two transistors coupled between the differential signaling device and ground, and the differential signaling circuit comprises at least four transistors.

In an embodiment, the compensation signal fed back to the signal driving circuit compensates the current signal variation of the first current source so as to stabilize the analog image signal generated by the signal driving circuit.

Each of the first and the second current mirror circuits, for example, includes two transistors.

In an embodiment, the signal compensation circuit further comprises a first and a second shunting resistors electrically connected between the signal driving circuit and the voltage-to-current converting circuit for shunting the analog image signal before the analog image signal is transmitted to the voltage-to-current converting circuit.

In an example, the signal driving circuit is electrically connected to two serially connected resistors of the LVDS receiving device for transmitting the analog image signal with a swing of 300 mV~350 mV to the LVDS receiving device.

Preferably, the base signal is a band-gap voltage signal generated by a band-gap circuit.

A second aspect of the present invention relates to a compensation circuit for use with a signal driving circuit of a low voltage differential signaling (LVDS) transmitting device, which comprises a signal converting circuit receiving an analog image signal from the signal driving circuit, and generating a compensation signal according to a voltage difference between the analog image signal and a base signal; and a current mirror circuit in communication with the signal driving circuit and the signal converting circuit, feeding the compensation signal back to the signal driving circuit for compensating signal variation of the signal driving circuit.

A third aspect of the present invention relates to a method for stabilizing an analog image signal outputted from a signal driving circuit of an low voltage differential signaling (LVDS) transmitter to an LVDS receiver. The method comprises steps of: shunting the analog image signal; generating a compensation signal according to a voltage difference between the shunted analog image signal and a base signal; and feeding the compensation signal to the signal driving circuit to compensate the analog image signal via a mirroring operation between a current source and the compensation signal.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 3:
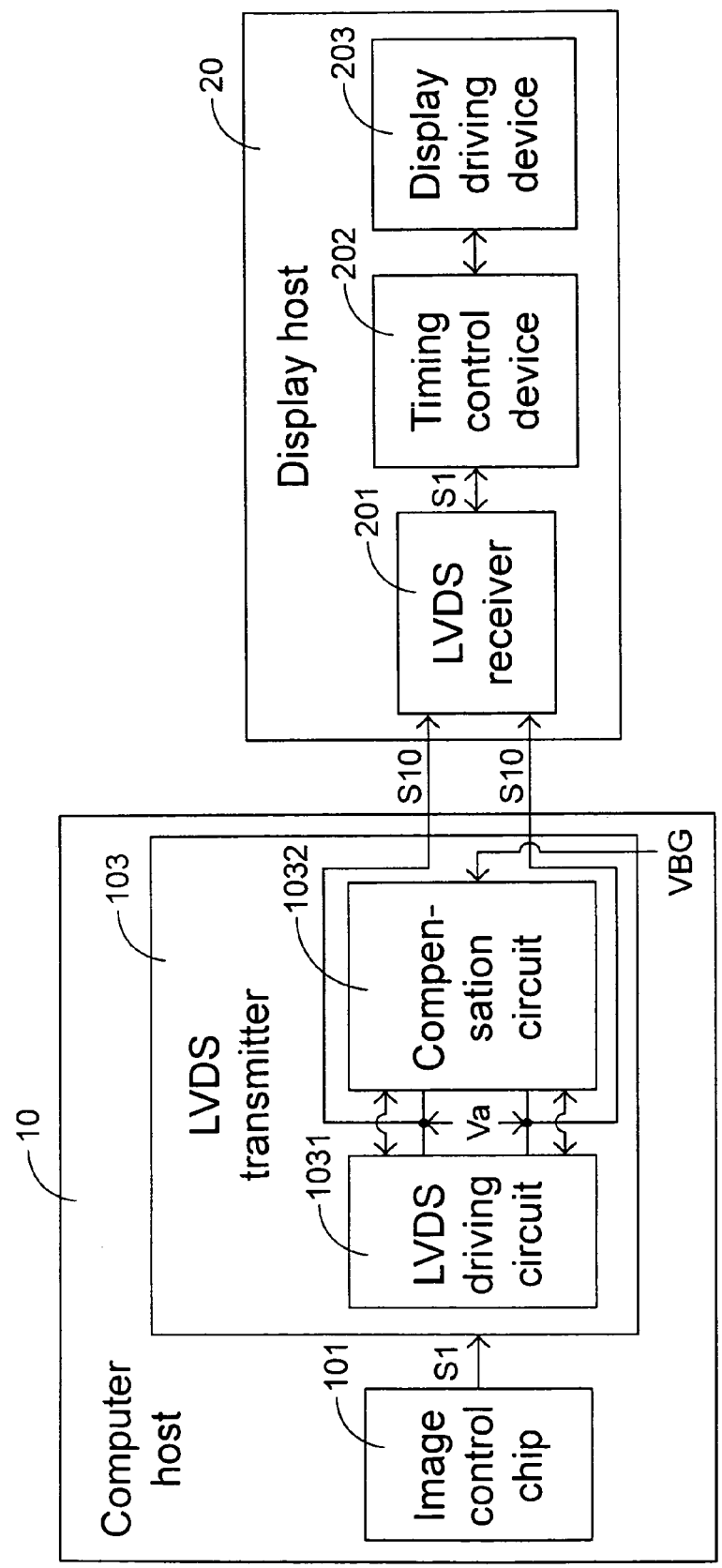
FIG. 3 is a functional block diagram schematically showing a digital display system using an LVDS transmitting device according to a preferred embodiment of the present invention.

Please refer to FIG. 3, an embodiment of the LVDS transmitting device according to the present invention is shown. The LVDS transmitting device 103 is applied to a system comprising a computer host 10 and a display host 20 such as a liquid crystal display (LCD). An image control chip 101 inside the computer host 10 outputs a digital image signal S1 to the LVDS transmitting device 103 to be modulated into an analog image signal S10 having a swing as low as 300 mV~350 mV. Then, via an LVDS driving circuit 1031, the analog image signal S10 is outputted to an LVDS receiver 201.

Figure 5:
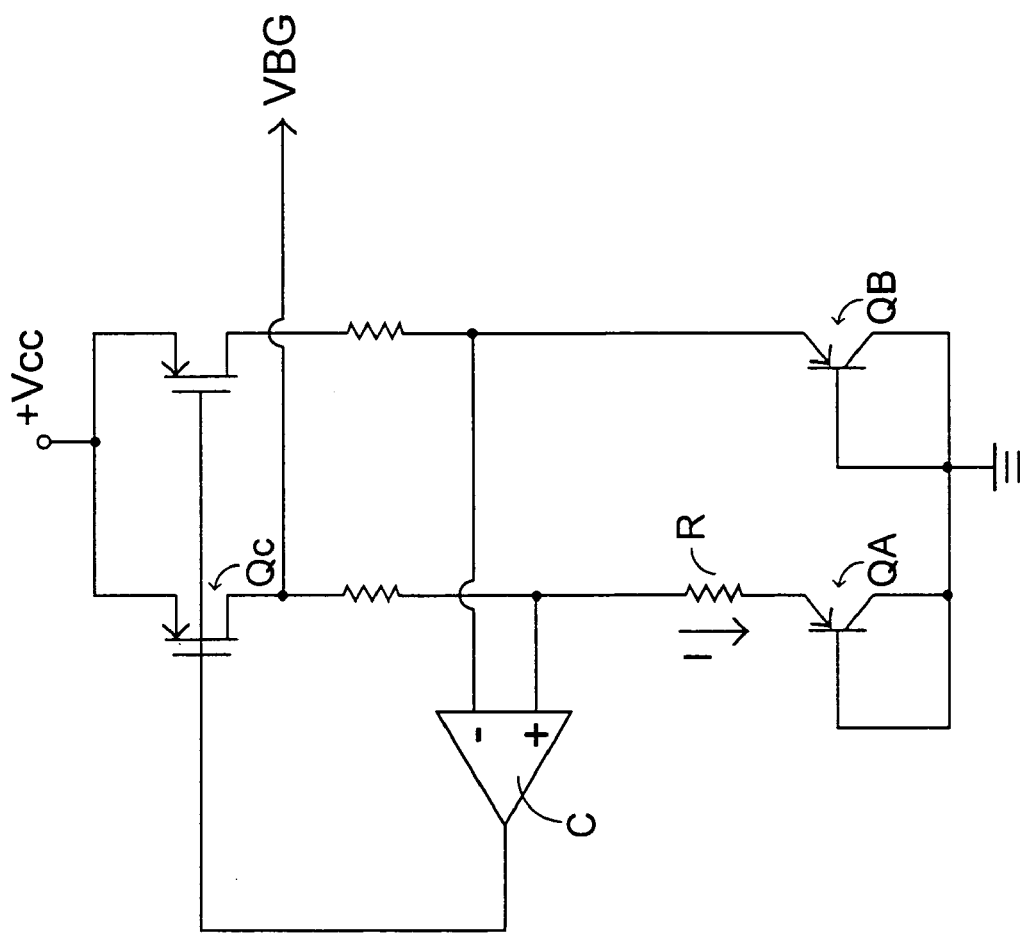
FIG. 5 is a circuit diagram showing an example of a band-gap circuit for generating a base signal to be provided for the LVDS transmitting device of the present invention for compensation.

The LVDS transmitting device 103 according to the present invention further comprises a signal compensation device 1032 coupled to the LVDS driving circuit 1031 for stabilizing the analog image signal S10 outputted by the LVDS driving circuit 1031 by way of feedback compensation. In order to achieve this purpose, a constant base signal VBG is introduced as a reference for the analog image signal S10 to be compared with. The voltage difference of the analog image signal S10 with the base signal VBG is fed back to the LVDS driving circuit 1031 to be referred for adjusting the analog image signal S10. By this way, the signal drift resulting from the physical property variation of the elements in the LVDS driving circuit 1031 due to manufacturing differentiations can be minimized. The constant base signal VBG can be provided by for example a band-gap circuit shown in FIG. 5. The base signal VBG is thus a band-gap voltage signal. As shown, due to the voltage difference between the base-emitter voltage of the transistor QA and the base-emitter voltage of the transistor QB, an electric current I is generated and a voltage is rendered at the resistor R. Via the voltage comparator C, the base signal VBG is generated and outputted from the transistor QC.

Figure 1:
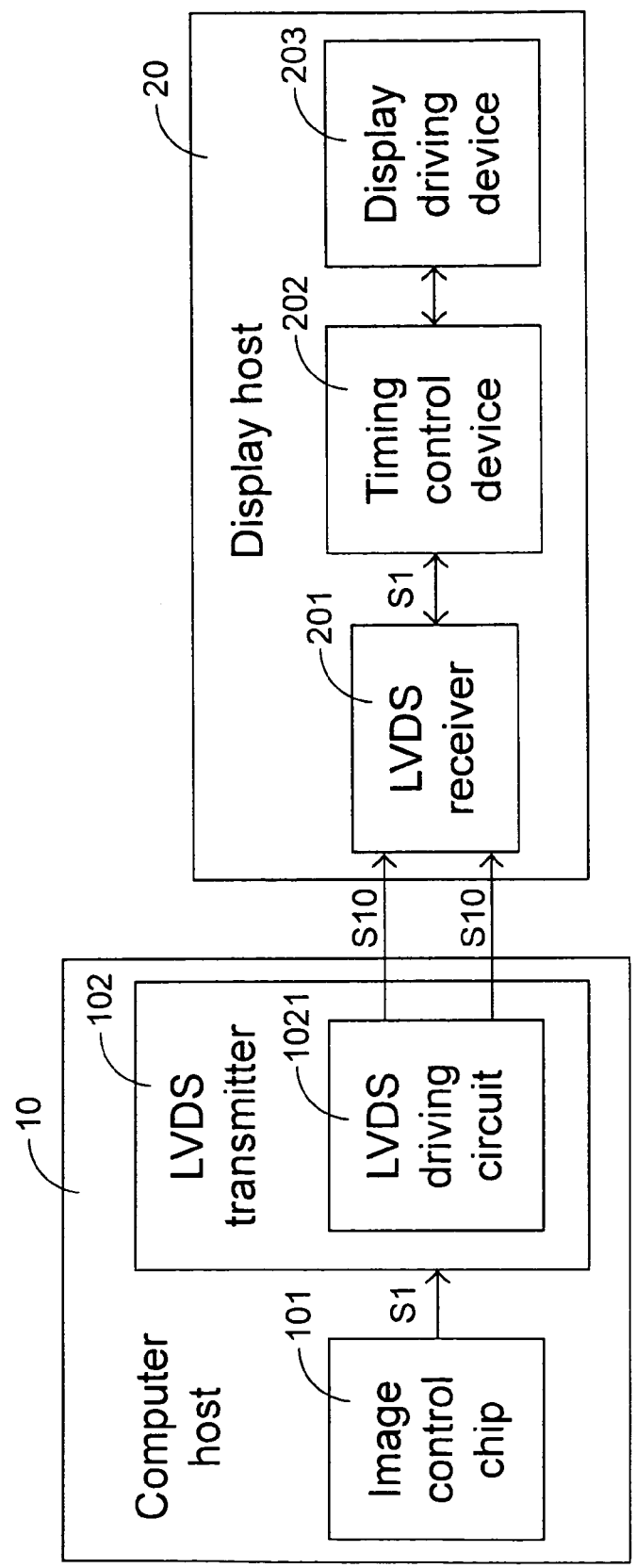
FIG. 1 is a functional block diagram schematically showing a conventional digital display system using LVDS transmission technique.
Figure 2:
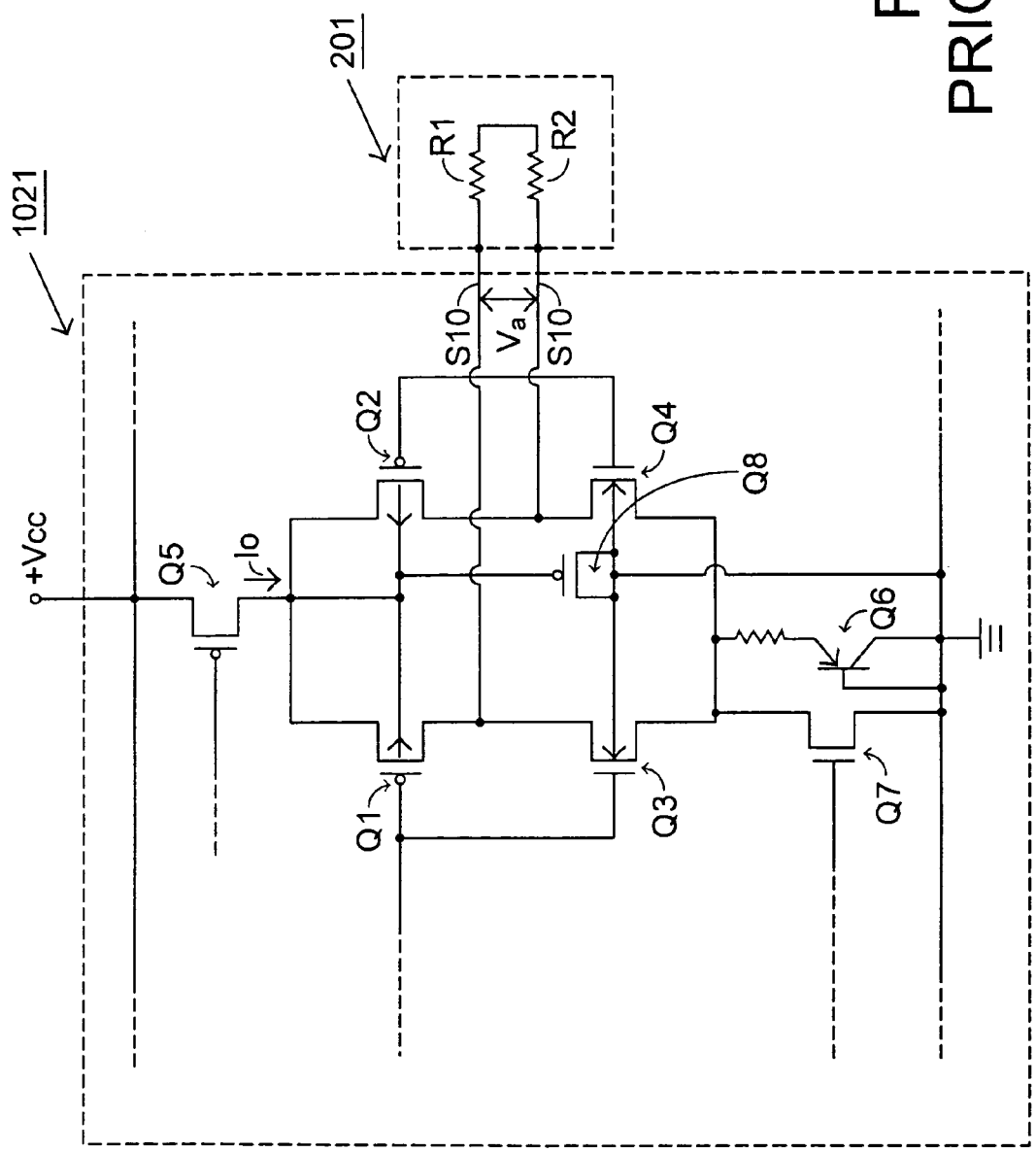
FIG. 2 is a circuit diagram showing the LVDS driving circuit of the digital display system of FIG. 1.
Figure 4:
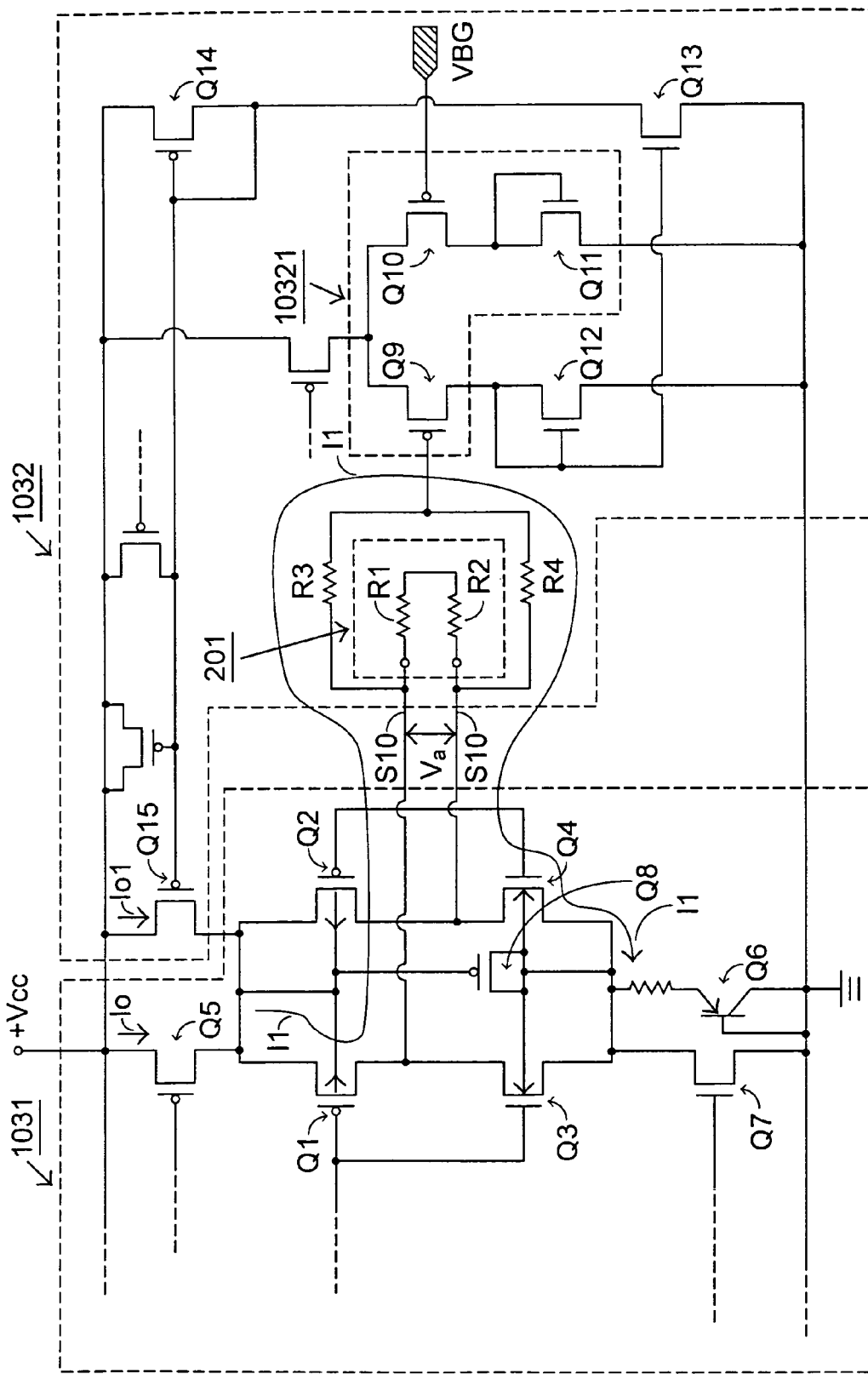
FIG. 4 is a circuit diagram showing the LVDS transmitting device of the digital display system of FIG. 3.

Please refer to FIG. 4, which is a circuit diagram showing an embodiment of the LVDS transmitting device 103. As mentioned above, the LVDS transmitting device 103 comprises the LVDS driving circuit 1031 and the signal compensation circuit 1032. The LVDS driving circuit 1031, similar to the one 1021 shown in FIG. 2, comprises a differential signaling circuit comprising of four transistors Q1~Q4, a first current source comprising a transistor Q5 and a second current source comprising transistors Q6 and Q7 interconnected in parallel. The first current source is electrically connected to a power source +Vcc and the differential signaling circuit, and the second current source is electrically connected to the differential signaling circuit and ground.

On the other hand, the signal compensation circuit 1032 comprises a first and a second shunting resistors R3 and R4, a voltage-to-current converter 10321, a first current mirror circuit comprising of transistors Q12 and Q13, and a second current mirror circuit comprising of transistors Q14 and Q15. The first and the second shunting resistors R3 and R4 are electrically connected between the LVDS driving circuit 1031 and the voltage-to-current converter 10321 for shunting the analog image signal S10 to be transmitted to the LVDS receiving device 201, and transmitting the shunted signal S10 to the voltage-to-current converter 10321. The voltage-to-current converter 10321, which comprises of transistors Q9~Q11, generates a current-type compensation signal Io1 according to the voltage difference between the analog image signal S10 and the base signal VBG. The first current mirror circuit comprising of transistors Q12 and Q13 is electrically connected between the voltage-to-current converter 10321 and ground. The second current mirror circuit comprising of transistors Q14 and Q15 is electrically connected to the first current mirror circuit, the power source +Vcc and the differential signaling circuit (transistors Q1~Q4) of the LVDS driving circuit 1031. The first and the second current mirror circuits feed the compensation signal Io1 back to the LVDS driving circuit 1031 so as to compensate the current signal variation of the first current source (i.e. the transistor Q5). By this way, the analog image signal S10 generated by the LVDS driving circuit 1031 can be stabilized.

For example, when the constant source current Io outputted by the transistor Q5 has a density higher than expected due to varying manufacturing factors, the intensity of the signal shunted by the resistors R3 and R4 and inputted into the voltage-to-current converter 10321 will become increased accordingly. Since the base signal VBG is kept at a constant level, the voltage difference between the analog image signal S10 and the base signal VBG will become decreased. Thus, the density of the current-type compensation signal Io1 is also reduced. By way of the mirroring functions of the first and the second current mirror circuits, the current density at the transistor Q15 is reduced as well. In other words, once the current density of the constant source current Io is enhanced, the compensation signal Io1 will function to decrease the current density so as to maintain the source current I1 consisting of the constant source current Io and the current-type compensation signal Io1 at a constant value. Accordingly, the differential signaling circuit can output the analog image signal S10 with substantially constant swing in response to the compensated source current I1. The signal variation problem resulting from varying manufacturing factors can thus be solved.

In brief, the present invention provides feedback compensation means to adjust and stabilize the analog image signal so as to make use of the LVDS technique in the digital display system.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A low voltage differential signaling (LVDS) transmitting device, comprising:
   a signal driving circuit for generating and outputting an analog image signal to an LVDS receiving device, comprising a differential signaling device including at least four transistors, a first current source including a transistor coupled between a power source and said differential signaling device, and a second current source including at least two transistors coupled between said differential signaling device and ground; and
   a signal compensation circuit in communication with said signal driving circuit, comprising:
   a voltage-to-current converting circuit for generating and outputting a compensation signal as a current type in response to said analog image signal and a base signal; and
   a first current mirror circuit and a second current mirror circuit for feeding said compensation signal back to said signal driving circuit, wherein said first current mirror circuit is coupled to said voltage-to-current converting circuit and ground, and said second current mirror circuit is coupled to said first current mirror circuit, a power source and a differential signaling circuit of said signal driving circuit, thereby compensating the current signal variation of said first current source so as to stabilize said analog image signal generated by said signal driving circuit.

2. The LVDS transmitting device according to claim 1 wherein said voltage-to-current converting circuit outputs said compensation signal according to a voltage difference between said analog image signal and base signal.

3. The LVDS transmitting device according to claim 1 wherein each of said first and said second current mirror circuits includes two transistors.

4. The LVDS transmitting device according to claim 1 wherein said signal compensation circuit further comprises a first and a second shunting resistors electrically connected between said signal driving circuit and said voltage-to-current converting circuit for shunting said analog image signal before said analog image signal is transmitted to said voltage-to-current converting circuit.

5. The LVDS transmitting device according to claim 1 wherein said signal driving circuit is electrically connected to two serially connected resistors of said LVDS receiving device for transmitting said analog image signal with a swing of 300 mV~350 mV to said LVDS receiving device.

6. The LVDS transmitting device according to claim 1 wherein said base signal is a band-gap voltage signal generated by a band-gap circuit.

7. A compensation circuit for use with a signal driving circuit of a low voltage differential signaling (LVDS) transmitting device, comprising:
   a signal converting circuit receiving an analog image signal from said signal driving circuit, and generating a compensation signal according to a voltage difference between said analog image signal and a base signal; and
   a current mirror circuit in communication with said signal driving circuit and said signal converting circuit, comprising at least two current mirror sub-circuits for feeding said compensation signal back to a specified current source of said signal driving circuit coupled between a power source and a differential signaling device of said signal driving circuit for compensating signal variation of said signal driving circuits,
   wherein each of said current mirror sub-circuits includes two transistors.

8. The compensation circuit according to claim 7 wherein said signal converting circuit is a voltage-to-current converting circuit for outputting said compensation signal as a current type.

9. The compensation circuit according to claim 7 wherein said base signal is a constant voltage signal generated by a band-gap circuit.

10. The compensation circuit according to claim 7 wherein one of said sub-circuits is coupled to said signal converting circuit and ground, and another one of said sub-circuits is coupled to said power source and said differential signaling circuit of said signal driving circuit.

11. The compensation circuit according to claim 10 wherein said compensation signal fed back to said signal driving circuit compensates the current signal variation of said specified current source so as to stabilize said analog image signal generated by said signal driving circuit.

12. The compensation circuit according to claim 11 wherein said specified current source includes a transistor.

13. The compensation circuit according to claim 7 further comprising a first and a second shunting resistors electrically connected between said signal driving circuit and said signal converting circuit for shunting said analog image signal before said analog image signal is transmitted to said signal converting circuit.

14. A method for stabilizing an analog image signal outputted from a signal driving circuit of an low voltage differential signaling (LVDS) transmitter to an LVDS receiver, comprising steps of:
   shunting said analog image signal;

generating a compensation signal according to a voltage difference between said shunted analog image signal and a base signal; and feeding said compensation signal to a current source of said signal driving circuit coupled between a power source and a differential signaling device of said signal driving circuit to compensate said analog image signal via at least two mirroring operations performed by two current mirror sub-circuits between said current source and said compensation signal, wherein each of said current mirror sub-circuits includes two transistors.

15. The method according to claim 14 wherein said base signal is a constant band-gap voltage signal.

* * * * *